United States Patent
Henderson et al.

(10) Patent No.: US 6,217,671 B1
(45) Date of Patent: Apr. 17, 2001

(54) COMPOSITION FOR INCREASING ACTIVITY OF A NO-CLEAN FLUX

(75) Inventors: Donald W. Henderson, Ithaca; James Spalik, Kirkwood, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/461,557

(22) Filed: Dec. 14, 1999

(51) Int. Cl.[7] .................... B23K 35/362; B23K 35/363
(52) U.S. Cl. .................................... 148/23; 148/25
(58) Field of Search ........................... 148/23, 25

(56) References Cited

U.S. PATENT DOCUMENTS

| | | |
|---|---|---|
| 4,168,996 | 9/1979 | Zado . |
| 4,194,931 | 3/1980 | Zado . |
| 4,495,007 | 1/1985 | Zado . |
| 4,523,712 | 6/1985 | Zado . |
| 4,561,913 | 12/1985 | Zado . |
| 4,838,478 | 6/1989 | Froebel . |
| 4,988,395 | 1/1991 | Taguchi . |
| 4,994,119 | 2/1991 | Gutierrez . |
| 5,004,508 | 4/1991 | Mace . |
| 5,004,509 | 4/1991 | Bristol . |
| 5,041,169 | 8/1991 | Oddy . |
| 5,085,365 | 2/1992 | Turner . |
| 5,127,968 * | 7/1992 | Gomi et al. ............... 148/23 |
| 5,145,722 | 9/1992 | Kaspaul . |
| 5,378,290 | 1/1995 | Tazi . |
| 5,417,771 | 5/1995 | Arita . |
| 5,443,660 | 8/1995 | Gao . |
| 5,507,882 | 4/1996 | Bristol . |
| 5,514,414 | 5/1996 | Gao . |
| 5,531,838 | 7/1996 | Arldt . |
| 5,571,340 | 11/1996 | Schneider . |
| 5,615,827 | 4/1997 | Arldt . |

FOREIGN PATENT DOCUMENTS

| | | |
|---|---|---|
| 6182586 | 7/1994 | (JP) . |
| 10-71487 | 3/1998 | (JP) . |
| 270850 | 11/1969 | (RU) . |

* cited by examiner

Primary Examiner—George Wyszomierski
Assistant Examiner—Janelle Combs-Morillo
(74) Attorney, Agent, or Firm—John Shannon

(57) ABSTRACT

An activated no-clean flux composition for soldering includes a dicarboxylic acid, an organic solvent, and acetic acid in the range of about 2% to about 4% by weight.

15 Claims, No Drawings

COMPOSITION FOR INCREASING ACTIVITY OF A NO-CLEAN FLUX

BACKGROUND OF THE INVENTION

1. Field of the Invention

The invention pertains to a flux composition for soldering, for example, a semiconductor chip or a chip carrier module to a printed circuit board.

2. Description of the Related Art

Fluxes play an important role in the procedures used to mount electronic components onto printed circuit cards and printed circuit boards (both of which are hereinafter generically referred to as printed circuit boards or PCBs). For example, one method for directly mounting a semiconductor integrated circuit device (hereinafter called a semiconductor chip or just a chip) onto a PCB is, for example, to form regions of solder, e.g., solder balls, on contact pads on the circuit-bearing surface of the chip. Such solder regions may also be formed on corresponding contact pads on the PCB. Then, a flux is applied to the solder regions on the chip and/or to the corresponding contact pads and/or corresponding solder regions on the PCB in order to remove oxide layers which may have formed on these solder regions or contact pads and to achieve increased wetting of the contact pads by the solder regions. Thereafter, with the circuit-bearing surface of the chip facing the PCB, the solder regions on the chip are brought into contact with the corresponding contact pads or solder regions on the PCB, and the resulting assembly is heated in order to melt, and thereby reflow, the solder regions on the chip and/or the PCB. Upon cooling and re-solidification, solder connections between the chip and the PCB result.

In a manner similar to that described above, one method for mounting a module, e.g., an organic module or a ceramic module, bearing semiconductor chips (hereinafter denominated a chip carrier module or just module) onto a PCB, involves forming, e.g., screening, regions of solder onto contact pads on the non-chip-bearing surface of the module. Such solder regions may also be formed on corresponding contact pads on the PCB. A flux is then applied to the solder regions on the module and/or the corresponding contact pads and/or corresponding solder regions on the PCB. Thereafter, with the non-chip-bearing surface of the module facing the PCB, the solder regions on the module are brought into contact with the corresponding contact pads or solder regions on the PCB and the resulting assembly is heated in order to melt, and thereby reflow, the solder regions on the chip and/or the PCB. Upon cooling and re-solidification, solder connections between the module and the PCB result.

If the module of interest has electrically conductive pins extending from the non-chip-bearing surface of the module, then the module is mounted onto a PCB by, for example, initially positioning the module over the top (i.e., the circuit-bearing) surface of the printed circuit board and inserting the electrically conductive pins of the module into corresponding, copper plated through holes (PTHs) extending through the thickness of the PCB. Then, the PCB and the module are placed on a conveyor, which passes the PCB and module over a fluxing wave or flux sprayer, which serves to impinge liquid flux onto the bottom surface of the PCB and into the PTHs. This flux is wicked up into the PTHs, and thus flux is applied to both the walls of the PTHs and to the pins extending into the PTHs. Thereafter, the conveyor passes the PCB and module over a solder wave, which serves to impinge liquid solder onto the bottom surface of the PCB and into the PTHs. This liquid solder is also wicked up into the PTHs, filling the PTHs and, upon cooling and solidification, serving to encapsulate the pins within the PTHs.

One of the most important aspects of the above-described chip-mounting and module-mounting procedures is the choice of flux. That is, as noted above, the flux serves to remove any oxide layers which may have formed on the solder regions, contact pads, pins or PTHs and to increase the wetting of, for example, contact pads by solder regions. A problem with commonly available fluxes is degraded flux components that interfere with underfill adhesion in soldered connections. The underfill adhesion is provided by a liquid adhesive having a low viscosity that is applied to soldered connections, such as those between chips and chip carriers, to fill in underneath for greater strength. Another problem is that, in most instances, at the completion of the soldering process, use of the commonly available fluxes results in ionic residues remaining on the solder regions, contact pads, pins or PTHs. Such ionic residues are undesirable because they lead to corrosion of circuitry and to short circuits. Consequently, if formed, such ionic residues must be removed, e.g., cleaned with water, after the completion of the soldering process.

The solder connections formed between a chip and a PCB or between a pinless module and a PCB, as described above, have relatively small heights, e.g., 4 mils, and therefore the spacing between a chip or pinless module and its PCB is correspondingly small. This is significant because it implies that it would be very difficult, if not impossible, to clear away any ionic residues remaining on the solder regions and/or contact pads after the completion of the soldering process. In addition, in the case of a pinned module, while corresponding ionic residues are readily cleaned with water, one must then deal with the environmental hazards posed by the resulting contaminated water.

Significantly, those engaged in the development of fluxes and soldering processes for mounting chips and modules onto PCBs have sought no-clean fluxes, which leave essentially no ionic residues on solder regions, contact pads, pins or PTHs at the completion of the corresponding soldering processes. As is described in U.S. Pat. No. 5,531,838, one no-clean flux includes pimelic acid, $HOOC(CH_2)_5COOH$, as the primary active ingredient, and two organic solvents, one with a relatively low evaporation temperature and one with a relatively high evaporation temperature.

No-clean fluxes are typically formulated to provide for complete volatility during reflux. As a consequence of this requirement, the active ingredients of the fluxes usually consist of weakly active volatile carboxylic acids dissolved in non-active volatile solvents. These fluxes may work very well as long as surface oxide thickness is kept to a minimum. However, when thicker oxides are present, such as those encountered with electrodeposited solders, significant non-wets may be observed. Furthermore, addition to these fluxes of typical activators, such as chlorinated or brominated amines or alcohols, results in residues which might not be tolerable.

SUMMARY OF THE INVENTION

By the present invention, a composition is provided which has an activator which enhances the solder wetting properties of a dicarboxylic acid and is completely volatile in a typical reflow profile. As a result, non-wets when plated solders are used are reduced to acceptable levels, while the low residue property of the flux is preserved.

More specifically, a low concentration of acetic acid, in the range of about 2% to about 4%, is added to a flux solvent system containing a dicarboxylic acid, such as adipic, pimelic or sebacic. Acetic acid, by itself in the solvent system, does not have noticeable fluxing characteristics.

Glacial acetic acid can serve as a flux, but heavy residues of lead around the solder sites are usually obtained. Such residues can be detrimental to the electrical properties. However, when acetic acid is added to a flux containing a dicarboxylic acid, it acts as a precursor to the formation of the higher molecular weight carboxylate lead and tin salts. The result is that a more complete reaction is achieved with deeper oxides and, as the temperature is raised during the reflux profile, the acetate ion is replaced by the higher molecular weight species.

DETAILED DESCRIPTION OF THE PREFERRED EMBODIMENT(S)

The invention involves a flux composition which leaves essentially no ionic residues at the completion of conventional soldering processes used to mount electronic components onto PCBs. Consequently, there is no need to clear away such ionic residues at the completion of these soldering processes with, for example, water, and therefore there is no need to deal with the environmental hazards posed by water contaminated with ionic residues.

The invention also involves the application of the flux composition to soldering processes used to mount electronic components, such as chips, chip carrier modules, resistors, capacitors, etc. onto PCBs.

Although acetic acid by itself does not have noticeable fluxing characteristics, when added in a low concentration to a solvent system containing a longer-chain dicarboxylic acid, it results in a more complete reaction with deeper oxides and, as the temperature is raised during reflow, the acetate ion is replaced by the higher molecular weight species. Usually, the amount of acetic acid in the composition is about 2% by weight. However, if the carboxylic acid is less than about 4.5% by weight, the amount of acetic acid can be increased from 2% to any amount up to 4% by weight.

Significantly, the flux composition includes a carboxylic acid as the active ingredient, i.e., as the primary fluxing agent. It should be noted that, at room temperature, carboxylic acids such as pimelic, adipic and sebacic are solids, and have respective melting temperatures of about 152 degrees C., about 105 degrees C., and about 134 degrees C. In addition, the flux composition of the present invention includes two organic solvents, the first of which has a relatively low evaporation temperature, e.g., 82.4 degrees C., and the second of which has a relatively high evaporation temperature, e.g., about 170 degrees C. The flux composition can also include a relatively small amount of water, preferably de-ionized water. Among carboxylic acids, pimelic acid ($HOOC(CH_2)_5COOH$) is preferred. It should be noted that pimelic acid, the second organic solvent and the water are soluble in the first organic solvent.

The first organic solvent is preferably isopropanol (isopropyl alcohol), which has an evaporation temperature of 82.4 degrees C. Useful alternatives to isopropanol include n-propanol and benzyl alcohol.

The second organic solvent is preferably propylene glycol monobutyl ether (also denominated N-butylpropylglycol ether), which has an evaporation temperature of about 170 degrees C. Useful other examples are glycol monobutyl ether include propylene glycol monopropyl ether and diethylene glycol monomethyl ether. Where pimelic acid is used as the carboxylic acid, upon evaporation of the first organic solvent during the soldering process, the pimelic acid (and the water, if present) is then substantially dissolved in the second organic solvent, until the second organic solvent evaporates during the soldering process.

The relative amount of carboxylic acid in the inventive flux composition ranges from about 1% to about 9% by weight. If the inventive flux composition is to be used, for example, in soldering a semiconductor chip to a PCB, then the relative amount of carboxylic acid is preferably 4.5% by weight. Relative amounts of carboxylic acid less than about 1% by weight are undesirable because they result in insufficient and/or inadequate fluxing action, i.e., insufficient and/or inadequate removal of oxide layers and insufficient reductions in solder surface tensions. Relative amounts of carboxylic acid greater than about 9% by weight are undesirable because they result in undesirably large amounts of residues at the completion of conventional soldering processes.

The first organic solvent, e.g., isopropanol, comprises about 75% by weight of the organic solvents overall, whereas the second organic solvent comprises about 25%.

The relative amount of water, if used, in the inventive flux composition ranges from 0% to about 2% by weight. The purpose of the water, if present, is to enhance the low temperature mobility of positively charged ions to accelerate the initiation of fluxing action by the pimelic acid. Relative amounts of water greater than about 2% by weight are undesirable because this significantly increases the possibility that the application of the inventive flux composition will result in ionic residues.

After the carboxylic acid, the acetic acid and any water are present in the relative amounts described above, the organic solvent comprises the rest of the inventive composition, the organic solvent containing the first organic solvent and the second organic solvent in a weight ratio of about 3 to 1.

By way of example, one embodiment of the inventive flux composition which is useful in soldering a semiconductor chip to a PCB is readily formed by dissolving 4.5 grams of pimelic acid, 2.0 grams of acetic acid, 25.0 grams of propylene glycol monobutyl ether and 1.0 grams of de-ionized water in 75.0 grams of isopropanol.

In mounting a semiconductor chip, such as in the so-called flip-chip configuration, onto a PCB, contact pads on the circuitry-bearing surface of the chip are provided with solder regions, e.g., solder balls. These solder regions have compositions which include, for example, 97 atomic percent lead (Pb) and 3 atomic percent tin (Sn). Significantly, such solder regions have relatively high melting temperatures, and do not melt during the soldering process described below.

Prior to soldering the chip to the PCB, contact pads on the circuitry-bearing surface of the PCB are provided with relatively small solder regions, e.g., relatively small solder balls. These relatively small solder regions are readily transported to, and deposited on, the contact pads via a decal. By contrast with the solder regions used with the chip, the solder regions of the PCB have compositions which include, for example, 37 atomic percent Pb and 63 atomic percent Sn. These solder regions have melting temperatures of 183 degrees C. and do melt during the soldering process described below.

Prior to soldering the chip to the PCB, the inventive flux composition is applied to the solder regions of the chip, and/or the contact pads on the PCB, and/or the contact pads on the chip. This is readily accomplished using, for example, a syringe or a brush.

Having applied the inventive flux composition to the relevant solder regions and/or contact pads, the chip is positioned relative to the PCB so that the solder regions of the chip contact the solder regions of the PCB. Consequently, these combined solder regions substantially extend from the chip contact pads to the PCB contact pads.

With the solder regions of the chip and the PCB touching each other, the chip PCB assembly is heated in, for example, an oven. During this heating procedure, the oven temperature is initially raised to about 183 degrees C., and subsequently raised to about 250 degrees C. Then, the oven temperature is lowered to about 183 degrees C., and thereafter lowered to room temperature. As a consequence, the solder regions of the PCB undergo melting and flow around the solder regions of the chip, resulting in continuous metallurgical and electrical connections between the PCB and the chip. While the cleaning of these continuous connections would be extremely difficult, and perhaps even impossible, no such cleaning is needed because essentially no ionic residues remain at the completion of this soldering process.

At the completion of the above-described soldering process, the continuous solder connections between the PCB and the chip are preferably encapsulated in, for example, an epoxy resin, using conventional techniques.

If the electronic component to be mounted onto a PCB is, for example, a (pinless) chip carrier module bearing at least one semiconductor chip, then such a module is readily mounted by, for example, screening solder regions onto contact pads on the non-chip-bearing surface of the module. Such solder regions may also be screened onto corresponding contact pads on the PCB. The inventive flux composition is then applied to the solder regions and/or the module contact pads and/or the PCB contact pads, using, for example, a syringe or a brush. Thereafter, the module is positioned in relation to the PCB so that the solder regions on the module contact pads touch the solder regions on the PCB contact pads. Thus, these combined solder regions substantially extend from the module contact pads to the PCB contact pads. Then, with the module solder regions touching the PCB solder regions, the module/PCB assembly is heated in, for example, an oven in order to melt the module solder regions and/or the PCB solder regions.

By contrast with the above, if the electronic component to be mounted onto a PCB is, for example, a pinned chip carrier module bearing at least one semiconductor chip, then such a module is readily mounted by initially applying the inventive flux composition to the module pins and/or to the walls of corresponding PTHs in the PCB. This is readily accomplished (using any of a variety of conventional techniques) before the module pins are inserted into the PTHs, while the module pins are being inserted into the PTHs, or after the module pins are inserted into the PTHs. Preferably, this is accomplished after the module pins have been inserted into the PTHs by, for example, placing the module/PCB assembly on a conveyor which passes this assembly over a fluxing wave or a flux sprayer. This fluxing wave or flux sprayer serves to impinge the inventive flux composition onto the bottom surface of the PCB and into the PTHs. The impinged flux is wicked up into the PTHs, and thus the inventive flux composition is applied both to the walls of the PTHs and to the module pins. Thereafter, the conveyor preferably serves to pass the module/PCB assembly over a solder wave, which serves to impinge liquid solder onto the bottom surface of the PCB and into the PTHs. This liquid solder is also wicked up into the PTHs, filling the PTHs and, upon cooling and solidification, serving to encapsulate the pins within the PTHs.

If the electronic component to be mounted onto a PCB is, for example, a discrete, passive electronic component, such as an electrical resistor or capacitor, having leads instead of pins, then such an electronic component is readily mounted using a procedure which is almost the same as the used with a pinned chip carrier module. The only difference is that the leads of the discrete, passive electronic component are not positioned inside the PTHs. Rather, these leads are positioned adjacent the PTHs, e.g., these leads are placed in contact with the lands encircling the PTHs. Thus, when the component/PCB assembly is passed over the fluxing wave or flux sprayer, the inventive flux composition is wicked up into the PTHs, onto the lands and onto the bottom portions of the leads. Similarly, when the component/PCB assembly is passed over the solder wave, liquid solder is wicked up into the PTHs, onto the lands encircling the PTHs and onto the bottom portions of the leads.

While the invention has been particularly described with reference to preferred embodiments thereof, it will be understood by those skilled in the art that various changes in form and details may be made therein without departing from the spirit and scope of the invention.

What is claimed is:

1. A no-clean flux composition for use in soldering, consisting essentially of:
   a dicarboxylic acid;
   an organic solvent; and
   acetic acid in a concentration in the range of from about 2% to about 4% by weight.

2. The no-clean flux composition of claim 1, wherein the dicarboxylic acid is selected from the group consisting of adipic acid, pimelic acid, sebacic acid and combinations thereof.

3. The no-clean flux composition of claim 2, wherein the dicarboxylic is pimelic acid.

4. The no-clean flux composition of claim 1, wherein the dicarboxylic acid comprises about 1% to about 9% by weight of the composition.

5. The no-clean flux composition of claim 4, wherein the dicarboxylic acid is pimelic acid.

6. A no-clean flux composition comprising: a dicarboxylic acid; an organic solvent; and acetic acid, wherein the dicarboxylic acid comprises about 4.5% by weight of the composition, and the acetic acid comprises about 2% by weight of the composition.

7. The no-clean flux composition of claim 6, wherein the dicarboxylic acid is pimelic acid.

8. A no-clean flux composition comprising: a dicarboxylic acid; an organic solvent; and acetic acid in a concentration in a range of from about 2% to about 4% by weight, wherein the organic solvent comprises a first organic solvent selected from the group consisting of isopropanol, n-propanol and benzyl alcohol, and a second organic solvent selected from the group consisting of propylene glycol monobutyl ether, propylene glycol monopropyl ether, and diethylene glycol monomethyl ether.

9. The no-clean flux composition of claim 8, wherein the first organic solvent comprises about 75% by weight of the organic solvent and the second organic solvent comprises about 25% by weight of the organic solvent.

10. The no-clean flux composition of claim 8, wherein the first organic solvent is isopropanol, and the second organic solvent is propylene glycol monobutyl ether.

11. The no-clean flux composition of claim 6, further comprising water in the amount of 0% to about 2% by weight.

12. The no-clean flux composition of claim 8, wherein the dicarboxylic acid is selected from the group consisting of adipic acid, pimelic acid, sebacic acid and combinations thereof.

13. The no-clean flux composition of claim 12, wherein the dicarboxylic is pimelic acid.

14. The no-clean flux composition of claim 12, wherein the dicarboxylic acid comprises about 1% to about 9% by weight of the composition.

15. The no-clean flux composition of claim 6, wherein the dicarboxylic acid is selected from the group consisting of adipic acid, pimelic acid, sebacic acid and combinations thereof.

* * * * *